(12) United States Patent
Kwon et al.

(10) Patent No.: US 10,964,515 B2
(45) Date of Patent: Mar. 30, 2021

(54) PLASMA DIAGNOSTIC SYSTEM AND METHOD

(71) Applicant: KWANGWOON UNIVERSITY INDUSTRY-ACADEMIC COLLABORATION FOUNDATION, Seoul (KR)

(72) Inventors: Gi Chung Kwon, Seongnam (KR); Gi Won Shin, Seoul (KR); Hwan Hee Lee, Seoul (KR)

(73) Assignee: KWANGWOON UNIVERSITY INDUSTRY-ACADEMIC COLLABORATION FOUNDATION, Seoul (KR)

(*) Notice: Subject to any disclaimer, the term of this patent is extended or adjusted under 35 U.S.C. 154(b) by 55 days.

(21) Appl. No.: 16/604,985

(22) PCT Filed: Nov. 20, 2017

(86) PCT No.: PCT/KR2017/013180
§ 371 (c)(1),
(2) Date: Oct. 11, 2019

(87) PCT Pub. No.: WO2018/190486
PCT Pub. Date: Oct. 18, 2018

(65) Prior Publication Data
US 2020/0161107 A1 May 21, 2020

(30) Foreign Application Priority Data
Apr. 14, 2017 (KR) .................. 10-2017-0048643

(51) Int. Cl.
*H01J 7/24* (2006.01)
*H01J 37/32* (2006.01)
*H05H 1/24* (2006.01)

(52) U.S. Cl.
CPC .. *H01J 37/32935* (2013.01); *H01J 37/32183* (2013.01); *H01J 37/32449* (2013.01); *H01J 2237/0206* (2013.01); *H05H 1/24* (2013.01)

(58) Field of Classification Search
CPC .......... H01J 37/32935; H01J 37/32183; H01J 37/32449; H01J 2237/0206; H05H 1/24; H05H 1/0081; G01R 27/26
See application file for complete search history.

(56) References Cited

U.S. PATENT DOCUMENTS

2004/0262146 A1* 12/2004 Platt, Jr. .................. A61L 2/14
204/164

FOREIGN PATENT DOCUMENTS

| JP | 2004296612 A | 10/2004 |
|----|--------------|---------|
| JP | 2011515790 A | 5/2011 |

(Continued)

OTHER PUBLICATIONS

Search Report dated Feb. 13, 2018 for PCT Application No. PCT/KR2017/013180.

(Continued)

*Primary Examiner* — Minh D A

(57) ABSTRACT

The present invention relates to a plasma diagnosing system and method, and more particularly, to a system and a method for diagnosing plasma in real time using a change in a capacitance sensed by an electrode using a reference waveform having a frequency different from a plasma discharging frequency band region. The sensed capacitance varies before and after discharging plasma and the plasma is diagnosed using the change in capacitance in real time.

20 Claims, 16 Drawing Sheets

(56) References Cited

FOREIGN PATENT DOCUMENTS

| JP | 2012234817 A | 11/2012 |
|----|--------------|---------|
| KR | 20070057983 A | 6/2007 |
| KR | 20090066587 A | 6/2009 |
| KR | 20110041119 A | 4/2011 |

OTHER PUBLICATIONS

Lee, et al., "Floating probe for electron temperature and ion density measurement applicable to processing plasmas," Journal of Applied Physics, 2007, vol. 101, 033305, pp. 1-6.

* cited by examiner

[Fig. 1]
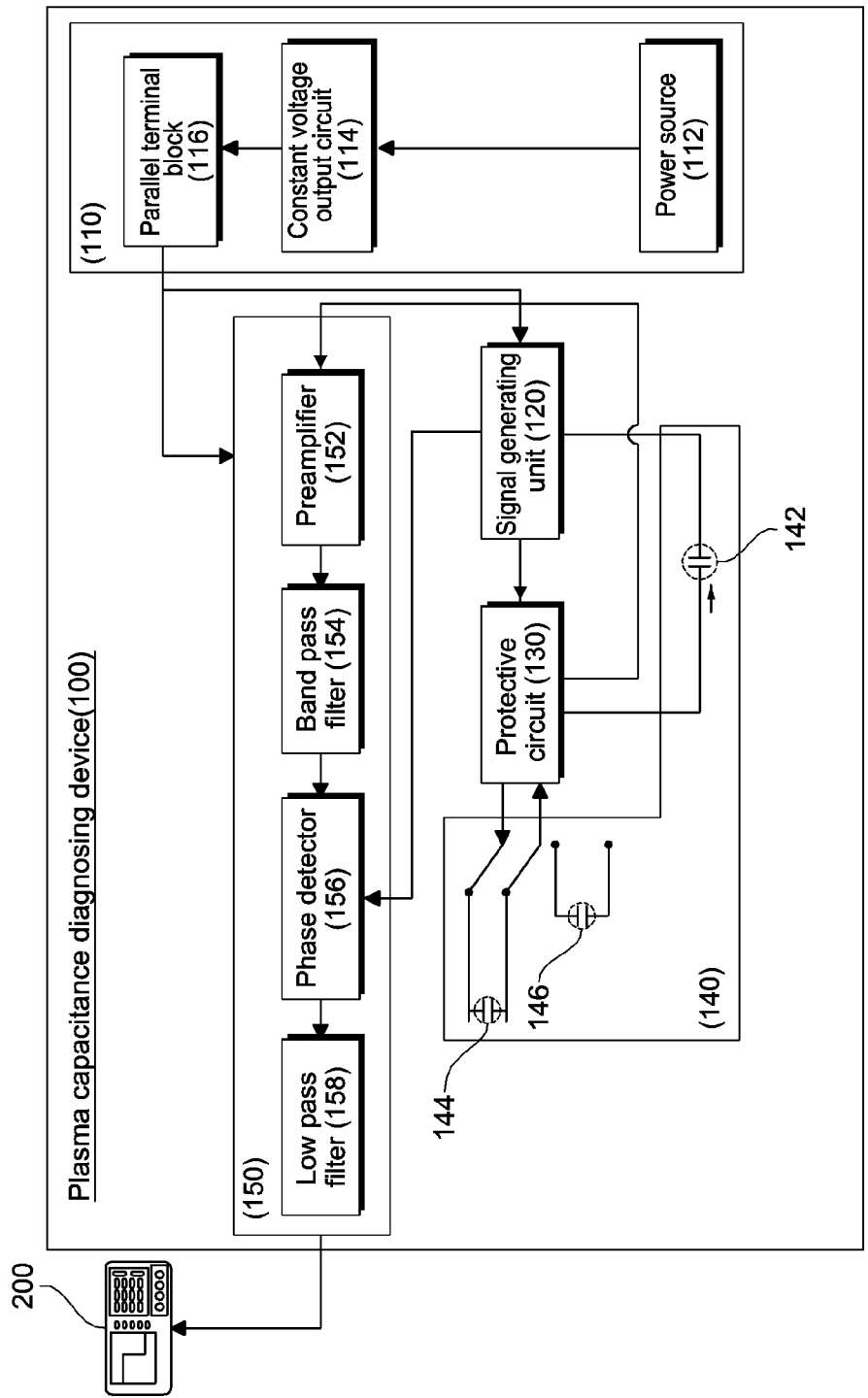

[Fig. 2]
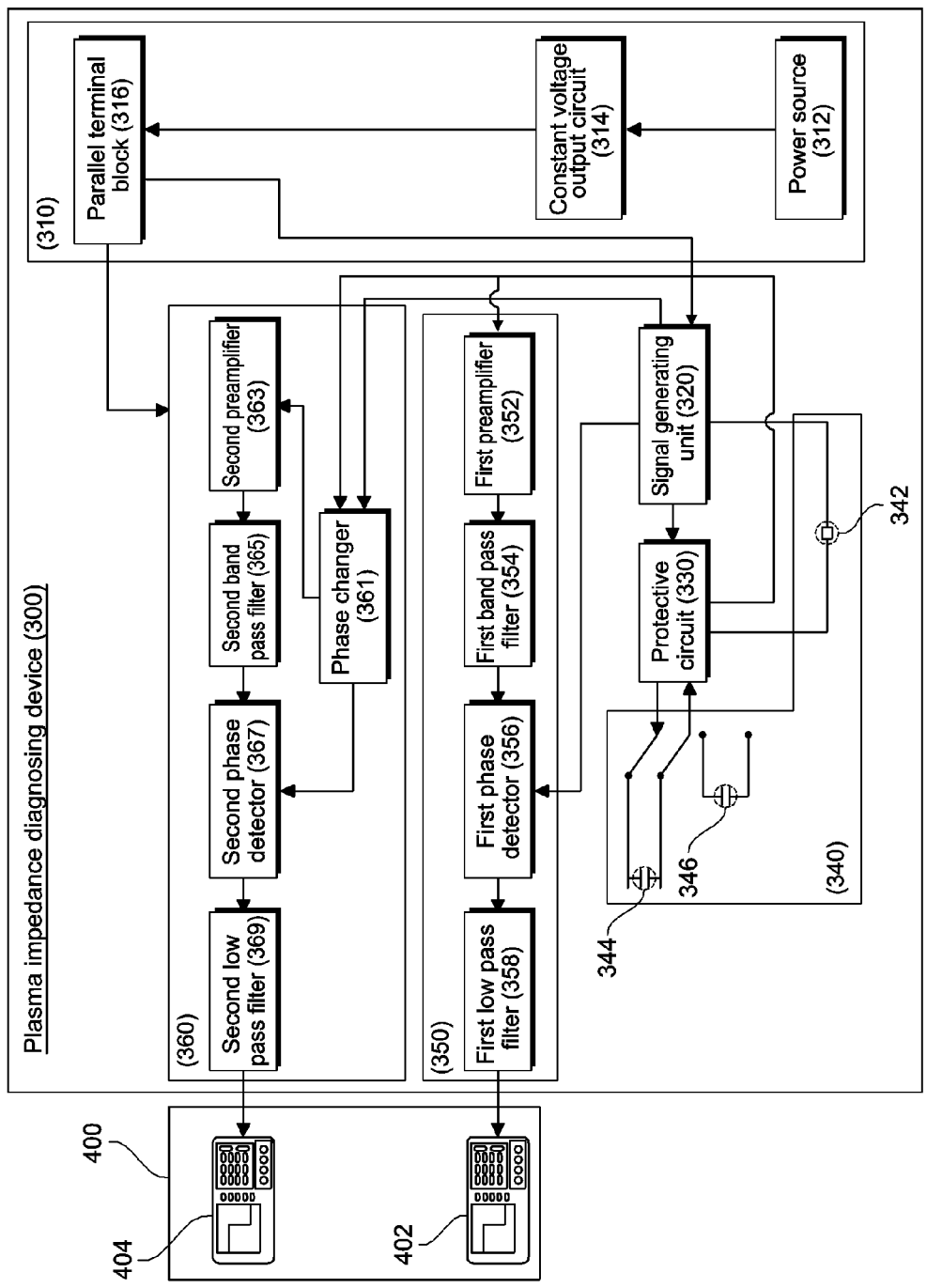

[Fig. 3]
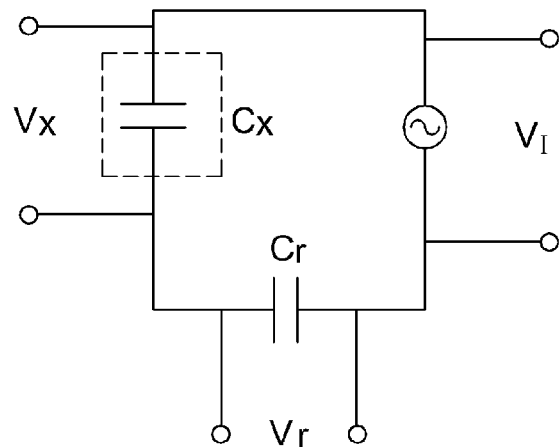
[Fig. 4]
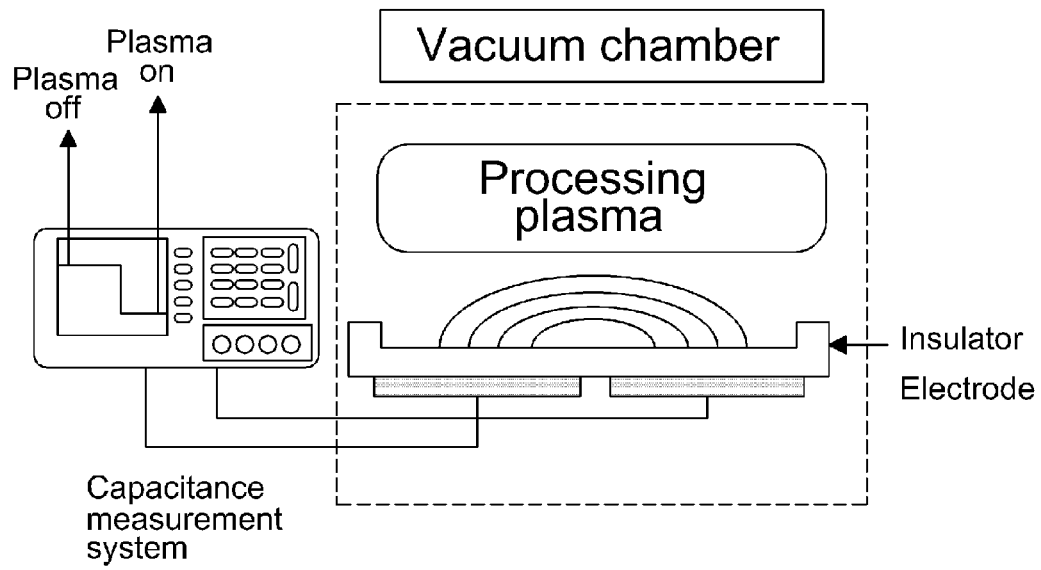

[Fig. 5]
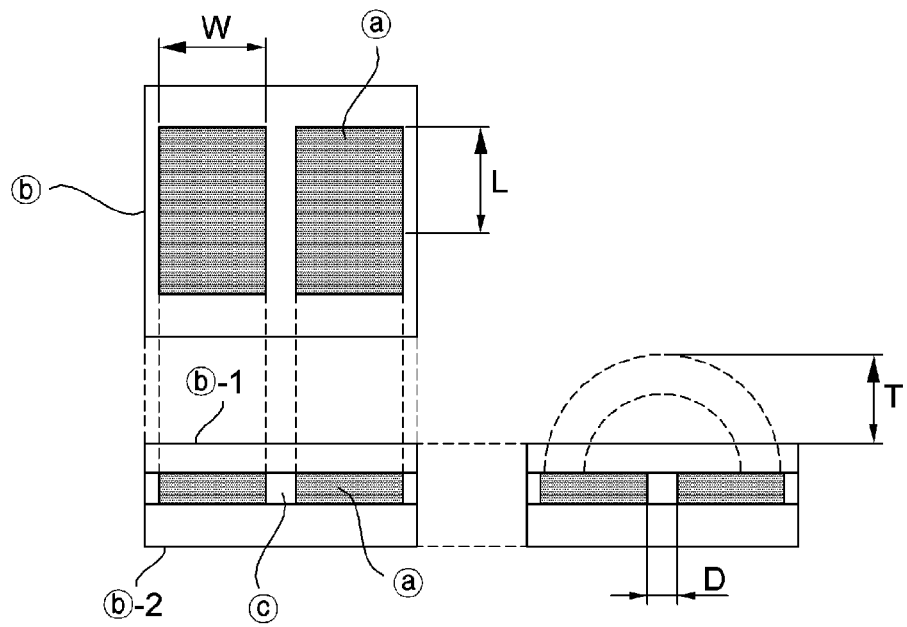
[Fig. 6]
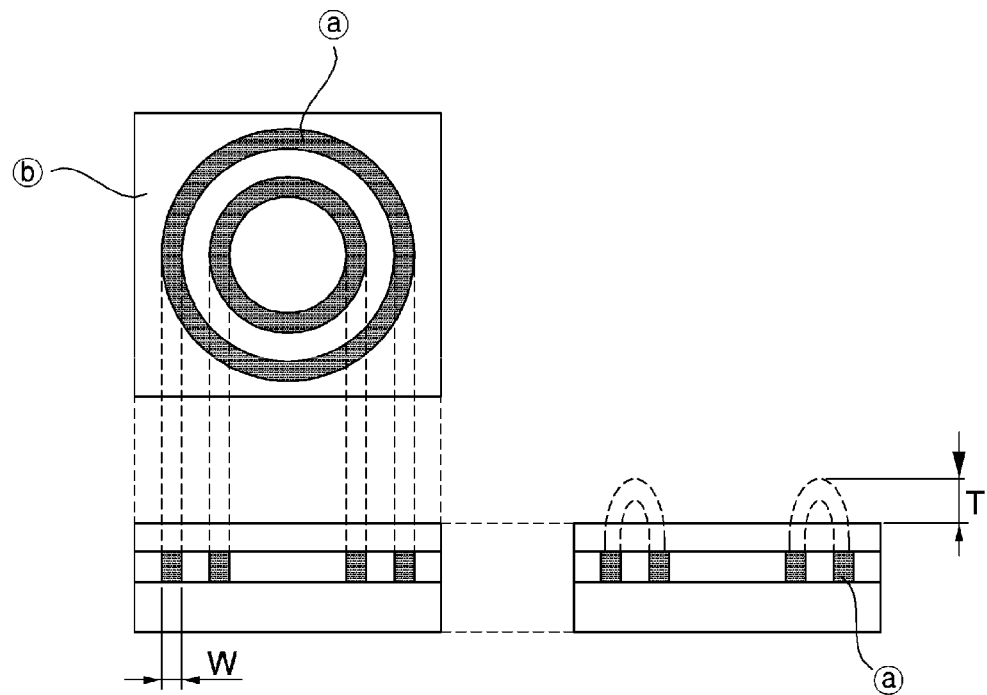

[Fig. 7]
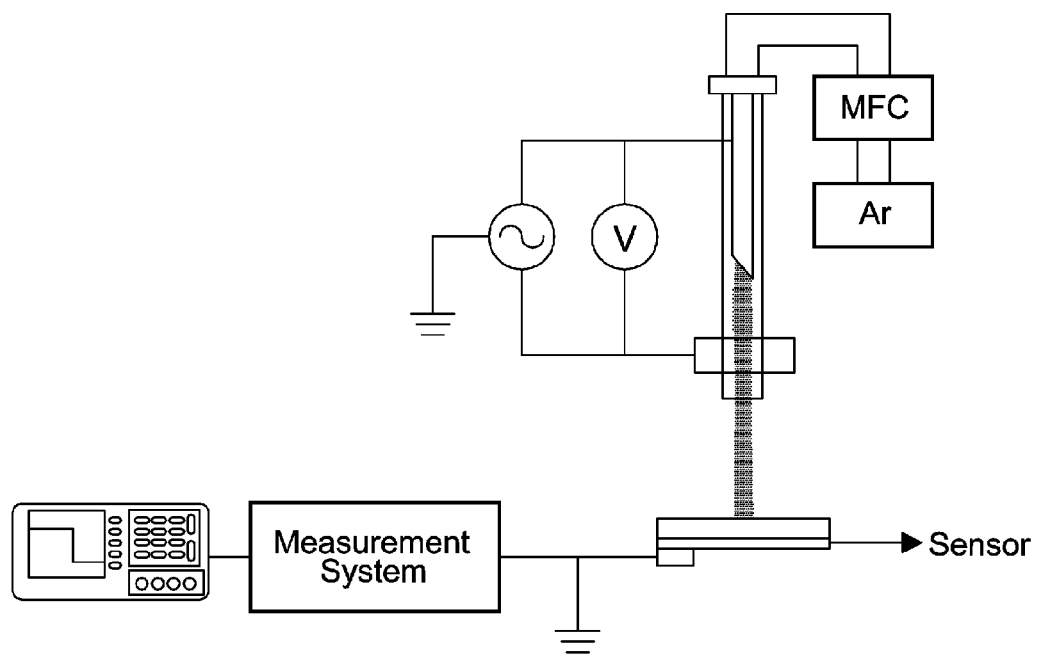
[Fig. 8]
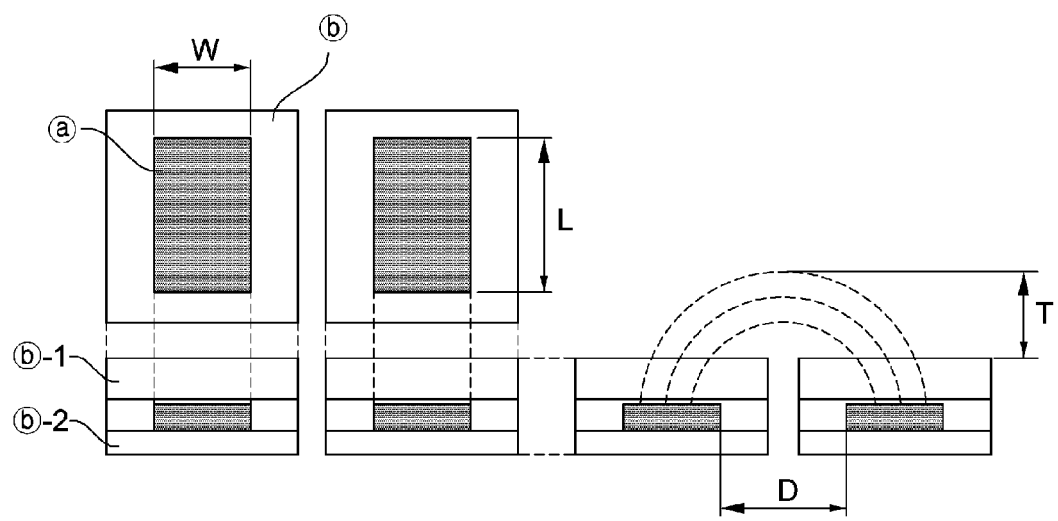

[Fig. 9]
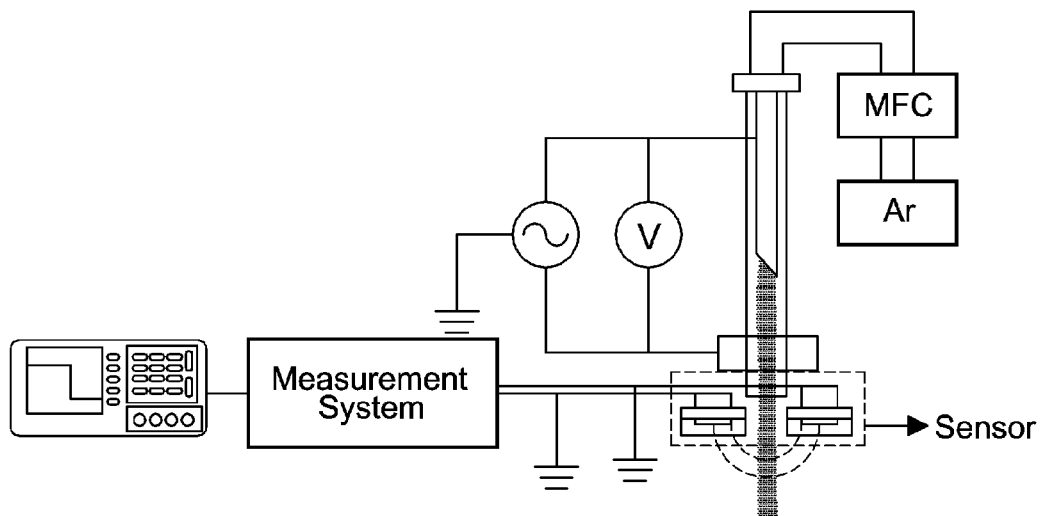
[Fig. 10]
| Capacitance | Capacitance measured by LCR meter | Error |
|---|---|---|
| 1 | 1.05 | 5% |
| 10 | 10.28 | 2.8% |
| 30 | 30.15 | 0.5% |
| 50 | 49.51 | 0.98% |

[Fig. 11]
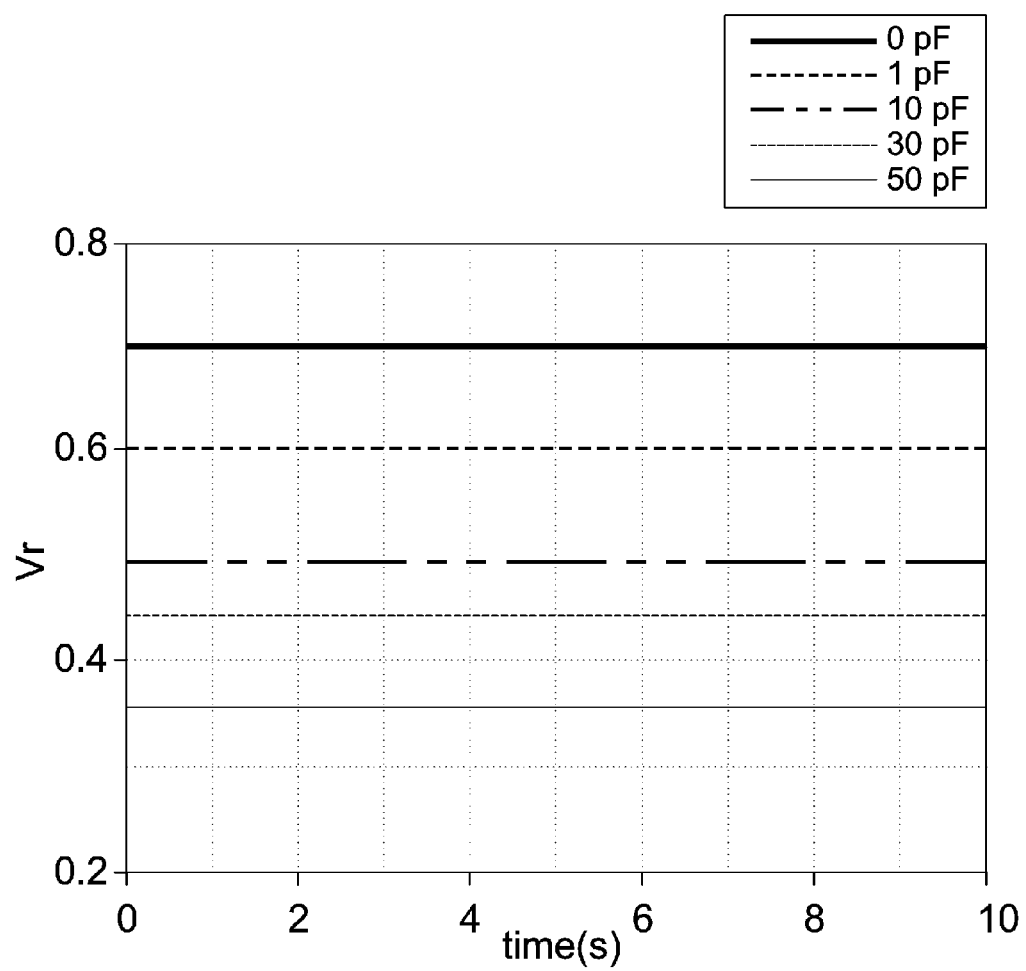

[Fig. 12]
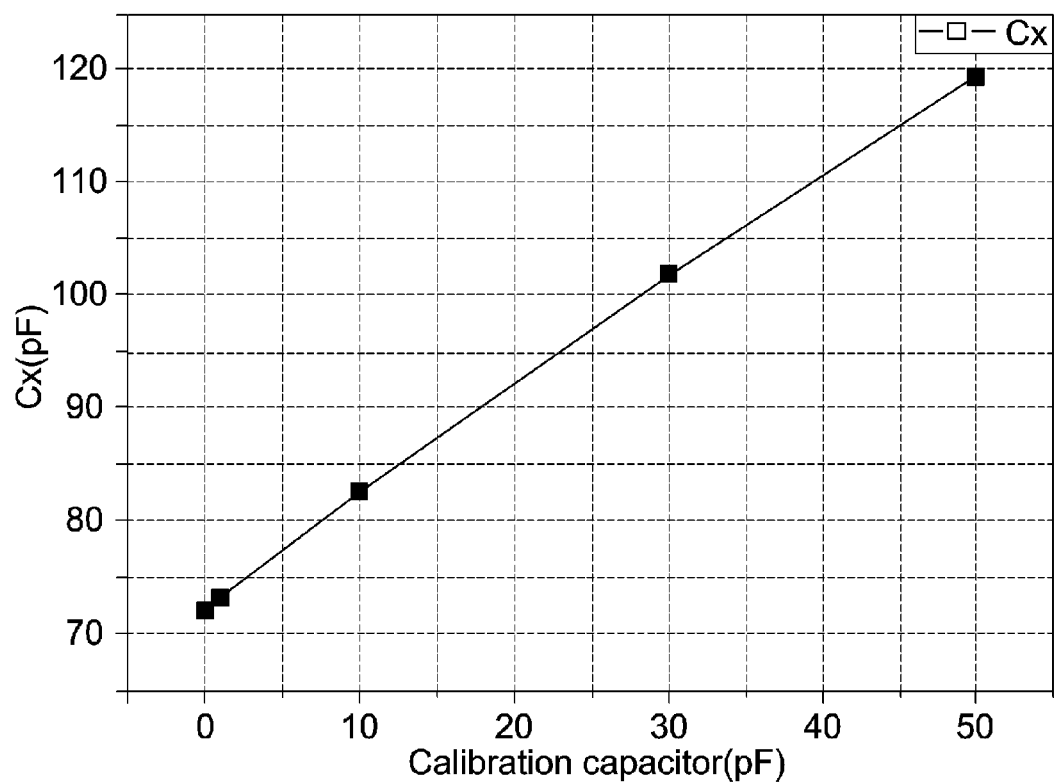

[Fig. 13]
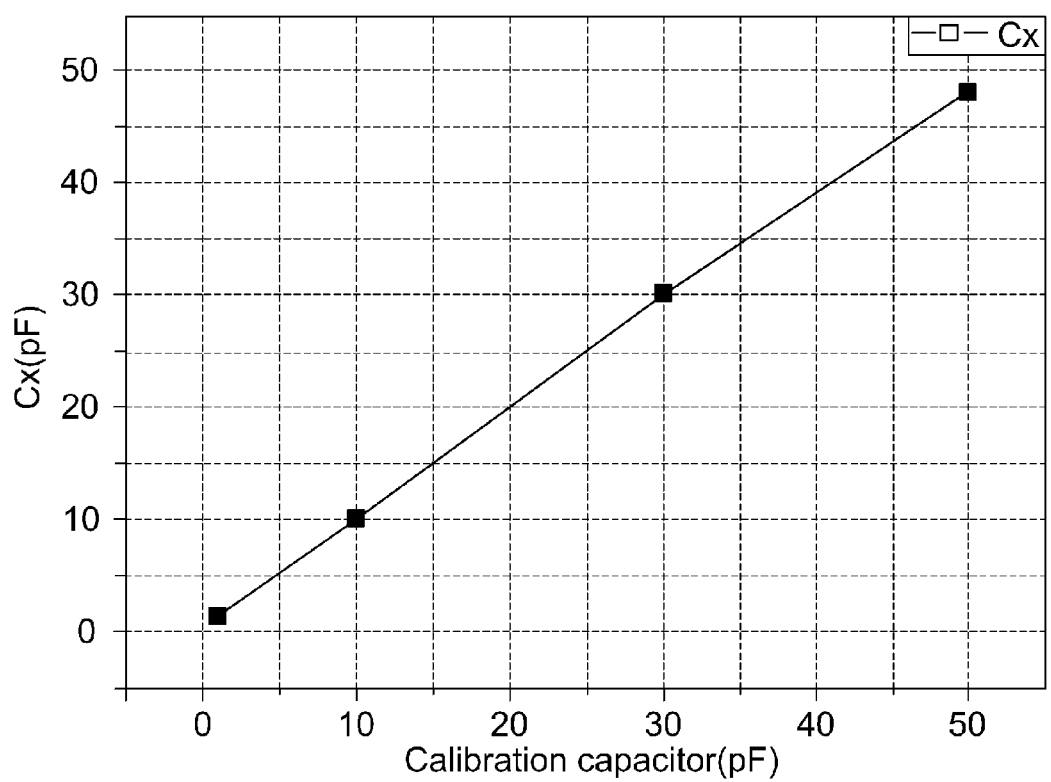

[Fig. 14]
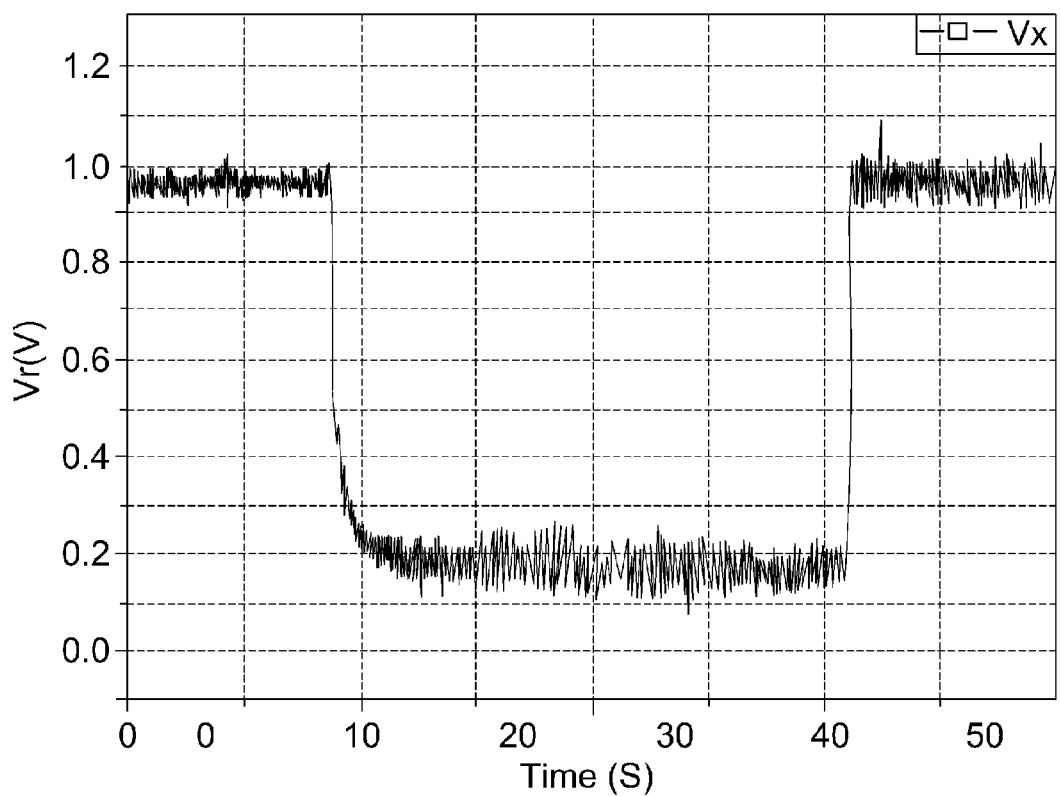

[Fig. 15]
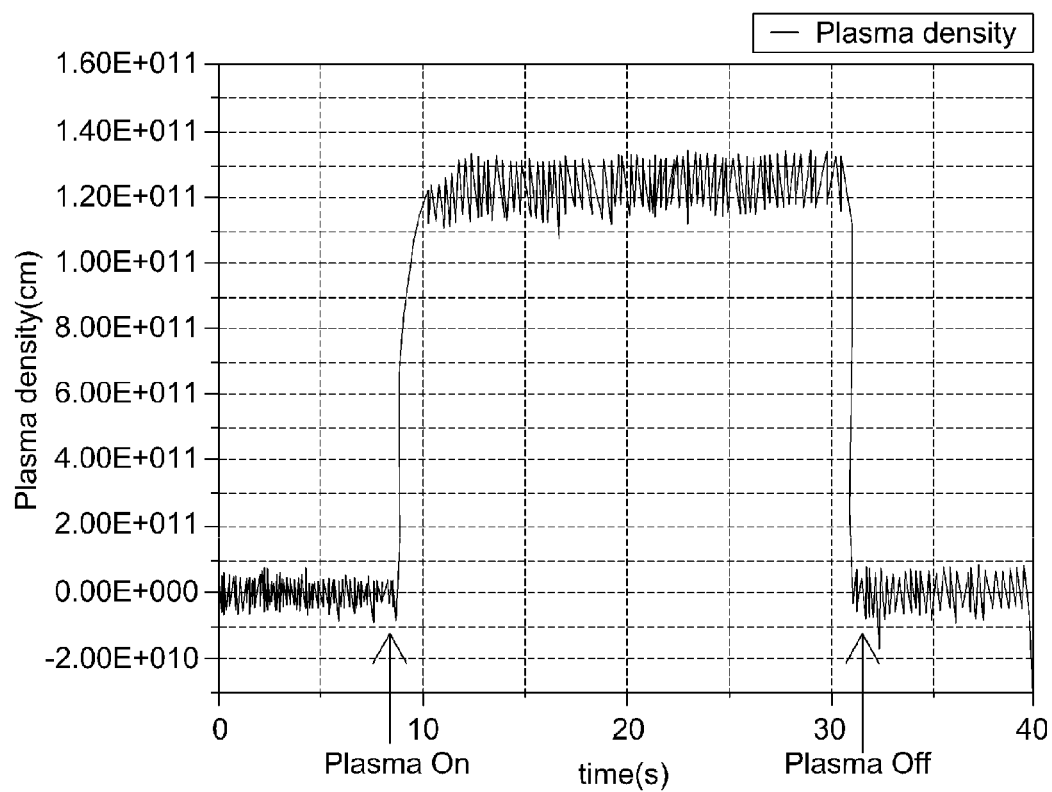

[Fig. 16]
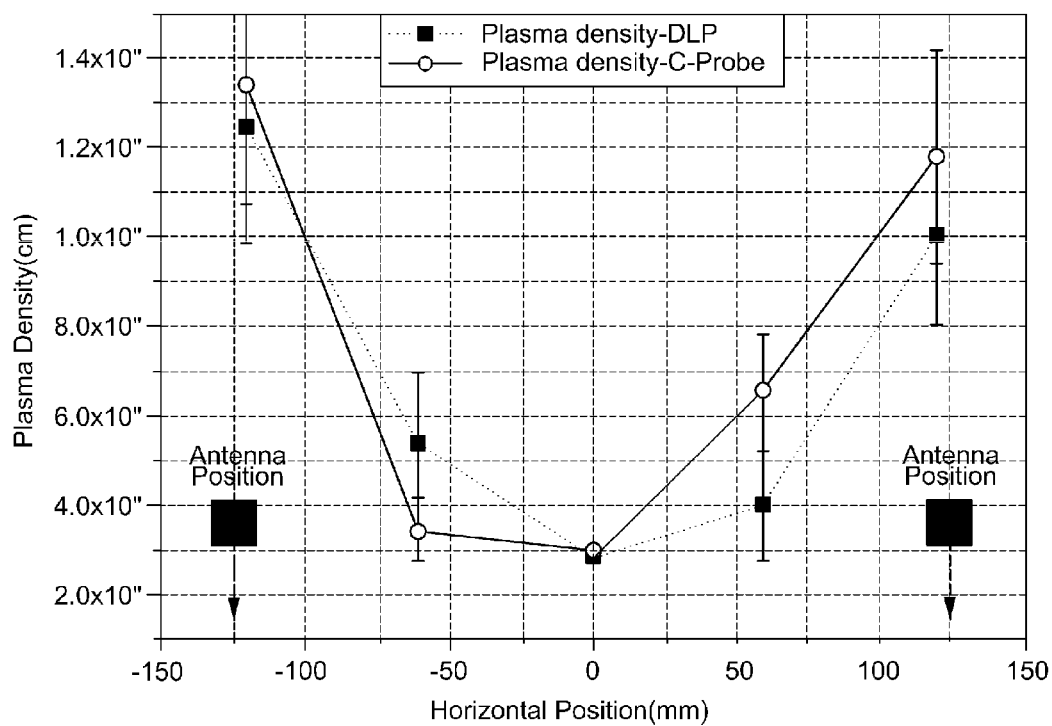

[Fig. 17]
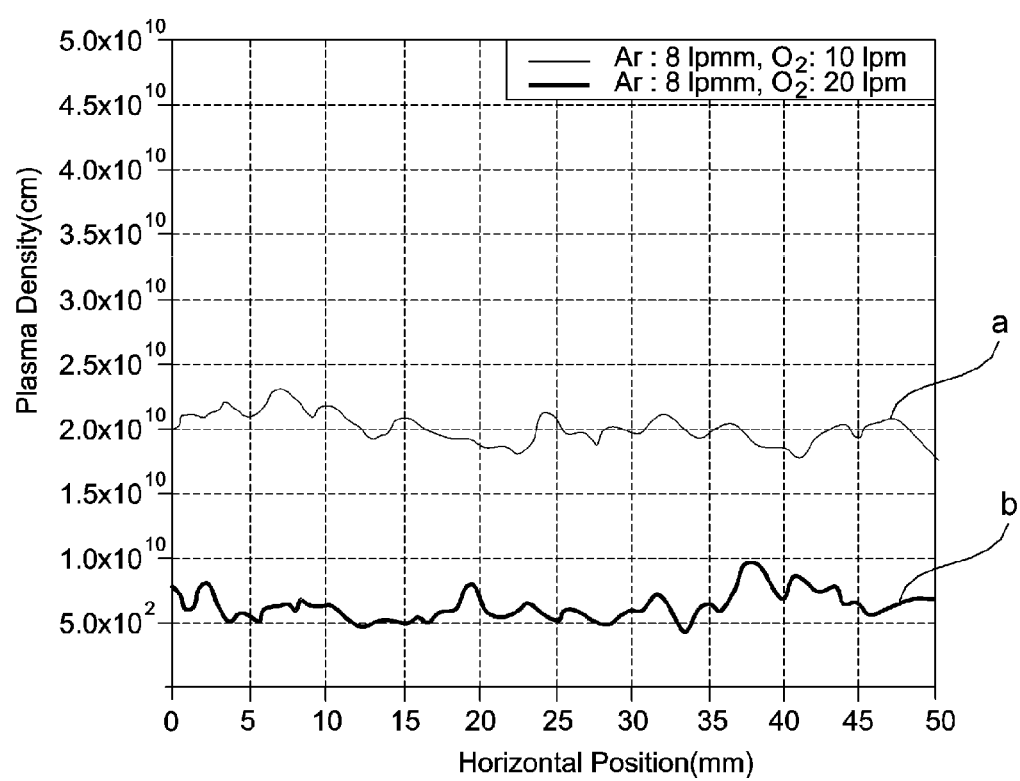

[Fig. 18]
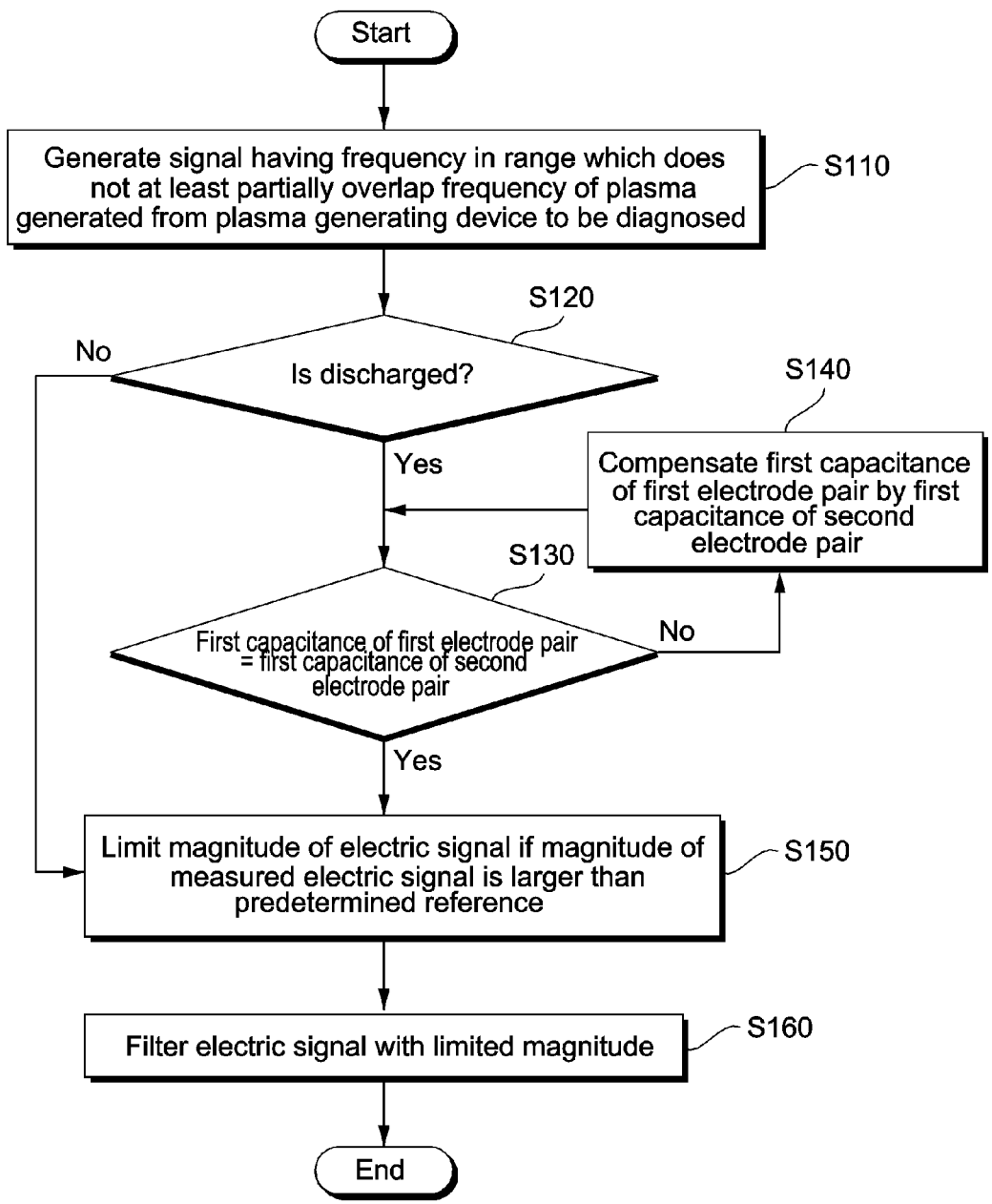

[Fig. 19]
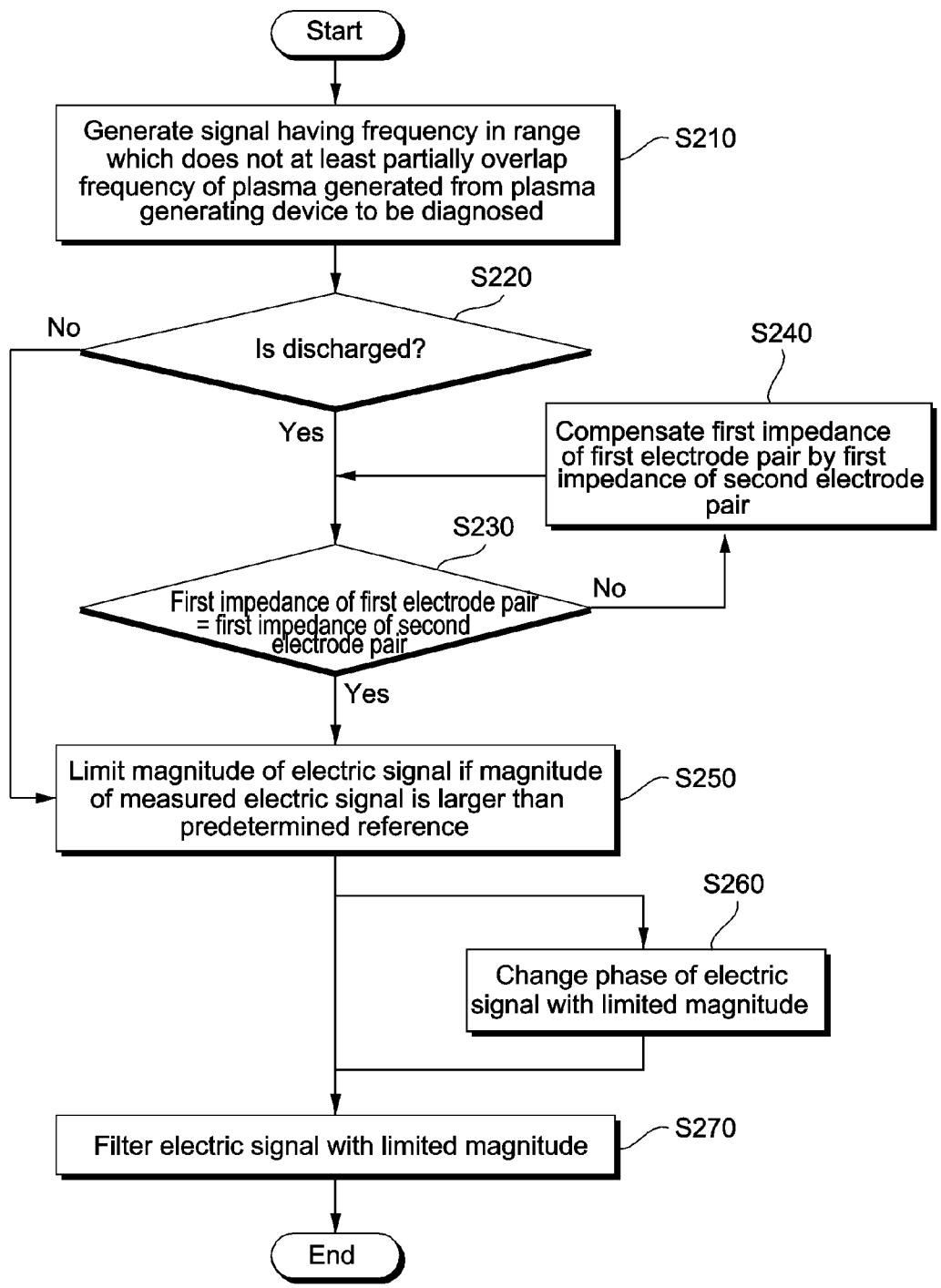

[Fig. 20]
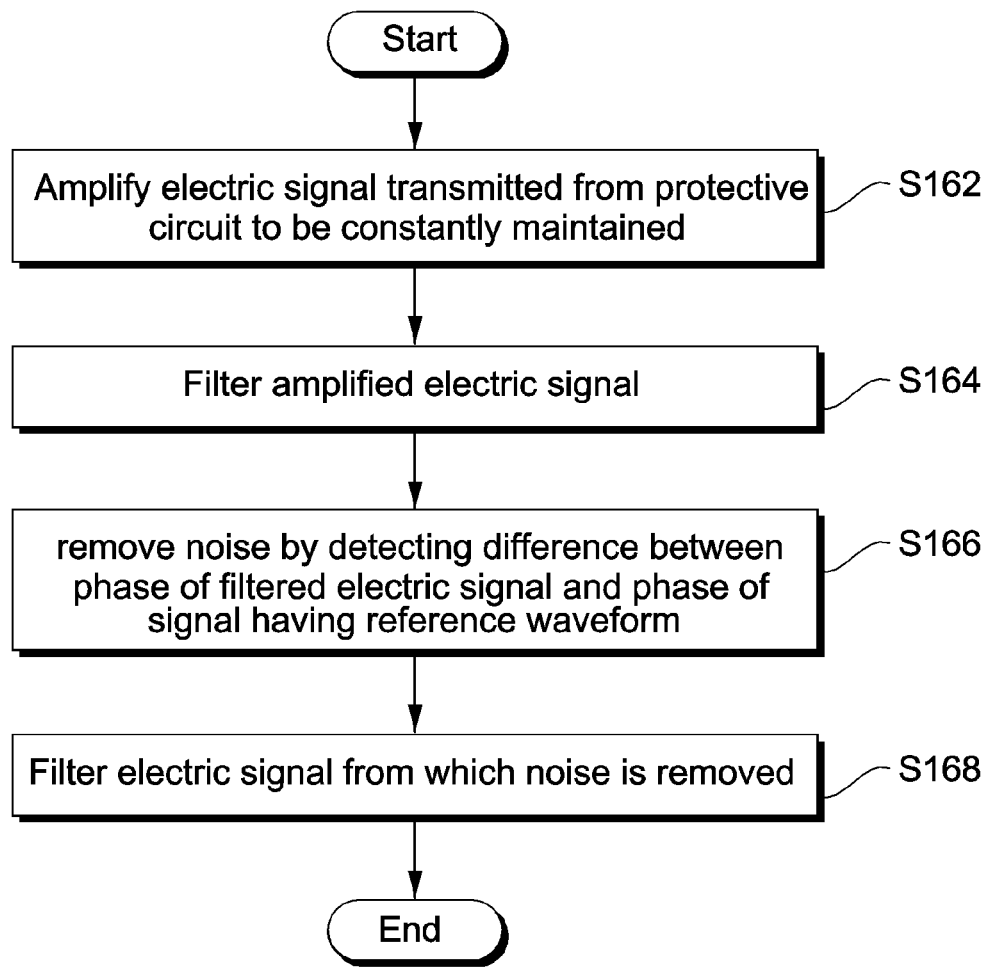

PLASMA DIAGNOSTIC SYSTEM AND METHOD

CROSS-REFERENCE TO RELATED APPLICATIONS

The present application is a U.S. National Stage of PCT/KR2017/013180 filed Nov. 20, 2017, which claims the priority benefit of Korean Patent Application No. 10-2017-0048643, filed on Apr. 14, 2017 in the Korean Intellectual Property Office.

NATIONAL PROJECT INFORMATION TO SUPPORT THE INVENTION IN THE APPLICATION

[Unique Project Number] 20173030014460
[Ministry Name] Ministry of Trade, Industry and Energy
[Research and Management Agency] Korea Institute of Energy Technology Evaluation and Planning
[Research Project Name] Energy Technology Development Project
[Research Task Name] Development of atmospheric plasma doping and annealing process for high efficiency crystalline silicon solar cells
[Organizer] YI-tech
[Research Period] 2017.05.01-2020.04.30

TECHNICAL FIELD

The present invention relates to a plasma diagnosing system and method, and more particularly, to a system and a method for diagnosing plasma in real time using a change in a capacitance sensed by an electrode before/after discharging the plasma.

BACKGROUND ART

A vacuum plasma process occupies a big part in the fields of a semiconductor, a display, or a solar cell. A necessity of precise process control in the manufacturing of a semiconductor is increasing due to the miniaturization of the semiconductor market and double patterning tech (DPT). In particular, a necessity of real-time plasma process diagnosing technique which may improve a degree of integration is increasing in the field of manufacturing a semiconductor device which is 20 nm or smaller.

In the related art, in order to measure characteristics of the plasma, a plasma frequency probe (Langmuir probe) in which a probe is perturbed in the plasma to measure a frequency is mainly used. However, according to this method, the probe is perturbed in the plasma to cause the interference with the plasma so that it is difficult to accurately measure the characteristics. Further, when a material is deposited on the probe during the plasma process, the information on the plasma through the probe is blocked. Therefore, there is a drawback in that it is difficult to measure the plasma using the probe during the process. Further, in some actual processes, the plasma is frequently discharged using mixture gas. When the mixture gas is used, it is difficult to diagnose a density of the plasma using the plasma frequency probe (Langmuir probe).

DISCLOSURE

Technical Problem

The present invention is conceived to improve the related art as described above and an object of the present invention is to accurately determine a state of the plasma by monitoring a plasma state in real time without having a distortion of a signal during the process.

Technical Solution

In order to achieve the above-mentioned object, according to an embodiment of the present invention, a plasma diagnosing system includes a signal generating unit which generates a signal having a frequency in a range which does not at least partially overlap a frequency of plasma generated from a plasma generating device to be diagnosed; a capacitance measuring unit which includes an electrode to which at least a part of plasma generated in the plasma generating device is deposited and the generated signal is applied and measures an electric signal in the electrode; a protective circuit which limits a magnitude of the electric signal when the magnitude of the electric signal measured in the capacitance measuring unit is larger than a predetermined reference; and a noise canceller which filters the electric signal transmitted from the protective circuit.

The signal generated from the signal generating unit may include a signal which is a reference for measuring the capacitance and has a reference waveform substantially having a sine wave component.

Further, the capacitance measuring unit may include a first electrode pair having a first capacitance on which at least a part of the plasma generated from the plasma generating device is deposited; and a second electrode pair having the first capacitance on which the plasma generated from the plasma generating device is not deposited.

The first electrode pair may include an electrode which forms a first capacitance and a dielectric layer which is formed of a dielectric material to cover both surfaces of the electrode to prevent the plasma generated from the plasma generating device from being in contact with the electrode.

Further, the capacitance measuring unit may further include a third electrode pair which is selectively and electrically connected to the first electrode pair and the second electrode pair and has a second capacitance.

Further, the first capacitance of the first electrode pair may be decreased as at least a part of the plasma generated from the plasma generating device is deposited.

The protective circuit may limit a magnitude of the electric signal or maintain the limited magnitude of the signal to be constant.

The noise canceller may include a preamplifier which amplifies an electric signal transmitted from the protective circuit to be constantly maintained; a band pass filter which filters the amplified electric signal; a phase detector which detects a difference between a phase of the filtered electric signal and a phase of a signal having the reference waveform to remove the noise; and a low pass filter which filters a signal from which the noise is removed.

According to another embodiment of the present invention, a plasma diagnosing system includes a signal generating unit which generates a signal having a frequency in a range which does not at least partially overlap a frequency of plasma generated from a plasma generating device to be diagnosed; an impedance measuring unit which includes an electrode to which at least a part of plasma generated in the plasma generating device is deposited and the generated signal is applied and measures an electric signal in the electrode; a protective circuit which limits a magnitude of an electric signal when the magnitude of the electric signal measured in the impedance measuring unit is larger than a predetermined reference; and a first filtering unit and a second filtering unit which filter an electric signal transmitted from the protective circuit.

The signal generated from the signal generating unit may include a signal which is a reference for measuring the impedance and has a reference waveform substantially having a sine wave component.

The impedance measuring unit may include a first electrode pair having a first impedance on which at least a part of the plasma generated from the plasma generating device is deposited; and a second electrode pair having the first impedance on which the plasma generated from the plasma generating device is not deposited.

The first electrode pair may include an electrode which forms a first capacitance; and a dielectric layer which is formed of a dielectric material to cover both surfaces of the electrode to prevent the plasma generated from the plasma generating device from being in contact with the electrode.

The impedance measuring unit may further include a third electrode pair which is selectively and electrically connected to the first electrode pair and the second electrode pair and has a second impedance.

The first impedance of the first electrode pair may be decreased as at least a part of the plasma generated from the plasma generating device is deposited.

The protective circuit may limit a magnitude of the electric signal or maintain the limited magnitude of the signal to be constant.

Further, the first noise canceller may include: a first preamplifier which amplifies an electric signal transmitted from the protective circuit to be constantly maintained; a first band pass filter which filters the amplified electric signal; a first phase detector which detects a difference between a phase of the filtered electric signal and a phase of a signal having the reference waveform to remove the noise; and a first low pass filter which filters a signal from which the noise is removed.

Further, the second noise canceller may include: a phase changer which changes a phase of an electric signal transmitted from the protective circuit; a second preamplifier which amplifies an electric signal with a changed phase to be constantly maintained; a second band pass filter which filters the amplified electric signal; a second phase detector which detects a difference between a phase of the filtered electric signal and a phase of a signal having the reference waveform to remove the noise; and a second low pass filter which filters a signal from which the noise is removed.

According to another embodiment of the present invention, a plasma diagnosing method includes generating a signal having a frequency in a range which does not at least partially overlap a frequency of plasma generated from a plasma generating device to be diagnosed; measuring an electric signal from an electrode on which at least a part of the generated plasma is deposited and the generated signal is applied; limiting a magnitude of the electric signal when the magnitude of the electric signal measured in the capacitance measuring unit is larger than a predetermined reference; and filtering an electric signal with the limited magnitude.

Further, the measuring of an electric signal may measure the electric signal using a first electrode pair having a first capacitance on which at least a part of the generated plasma is deposited; and a second electrode pair having the first capacitance on which the generated plasma is not deposited.

Further, the measuring of an electric signal may measure the electric signal further using a third electrode pair which is selectively and electrically connected to the first electrode pair and the second electrode pair and has a second capacitance.

Advantageous Effects

Therefore, according to the present invention, the plasma diagnosing device calculates a plasma density by measuring a change in capacitance during the plasma process to diagnose the plasma in real time so that in-situ monitoring is enabled. By using this, it is possible to contribute to improve a process yield during the plasma process and improve the reliability of a process result.

Further, during the process using a plasma diagnosing system in real time, when the plasma discharging state is not normal, the device is compensated through the feedback so that a positive effect in a semiconductor and a display industry can be expected.

DESCRIPTION OF DRAWINGS

FIG. 1 is a diagram of a plasma capacitance diagnosing device 100 according to an embodiment of the present invention.

FIG. 2 is a diagram of a plasma impedance diagnosing device 300 according to an embodiment of the present invention.

FIG. 3 is a schematic diagram of a measurement circuit of a plasma capacitance diagnosing device 100 according to an embodiment of the present invention.

FIG. 4 is a schematic view illustrating that a plasma capacitance diagnosing device 100 according to an embodiment of the present invention diagnoses plasma using a change in a first capacitance of a first electrode pair 144.

FIG. 5 is a view illustrating a first electrode pair formed in the form of a coplanar electrode according to an embodiment of the present invention.

FIG. 6 is a view illustrating a first electrode pair formed in the form of a coplanar electrode according to an embodiment of the present invention.

FIG. 7 is a view illustrating that the plasma is measured using a first electrode pair formed in the form of a coplanar electrode according to an embodiment of the present invention.

FIG. 8 is a view illustrating a first electrode pair formed in the form of a double-sided electrode according to an embodiment of the present invention.

FIG. 9 is a view illustrating that the plasma is measured using a first electrode pair formed in the form of a double-sided electrode according to an embodiment of the present invention.

FIG. 10 is a table illustrating a first capacitance measured by an LCR meter according to an embodiment of the present invention and an error of a first capacitance of a first electrode pole 144 with respect to the first capacitance measured by the LCR meter.

FIG. 11 is a view illustrating a first capacitance of a second electrode pair 146 according to an embodiment of the present invention and a voltage of a third electrode pair 142.

FIG. 12 is a view illustrating a result of comparing a first capacitance of a first electrode pair 144 according to an embodiment of the present invention and a first capacitance of a second electrode pair 146.

FIG. 13 is a view illustrating a result of comparing a first capacitance of a first electrode pair 144 obtained by removing a parasitic capacitance of the first electrode pair 144 according to an embodiment of the present invention and a first capacitance of a second electrode pair 146.

FIG. 14 is a view illustrating a result of measuring a change in voltage in accordance with plasma discharging according to an embodiment of the present invention.

FIG. 15 is a view illustrating a result of diagnosing a density of plasma using a change in capacitance in accordance with plasma discharging according to an embodiment of the present invention.

FIG. 16 is a view illustrating a result of comparing a plasma density measured using a double Langmuir probe (DLP) according to an embodiment of the present invention and a plasma density in every position in a space where a plasma diagnosing device is provided.

FIG. 17 is a graph of comparing a plasma density depending on a gas flow rate according to an embodiment of the present invention.

FIG. 18 is a flowchart illustrating a plasma capacitance diagnosing method according to an embodiment of the present invention.

FIG. 19 is a flowchart illustrating a plasma impedance diagnosing method according to an embodiment of the present invention.

FIG. 20 is a flowchart illustrating step S160 of FIG. 18 in detail.

BEST MODE

Hereinafter, an exemplary embodiment according to the present invention will be described with reference to the accompanying drawings in detail. Furthermore, when it is judged that specific description on known configurations or functions related in the description of the present invention may unnecessarily obscure the essentials of the present invention, the detailed description will be omitted.

Hereinafter, a configuration of a plasma diagnosing system 100 according to an embodiment of the present invention will be described in detail with reference to related drawings.

FIG. 1 is a diagram of a plasma capacitance diagnosing device 100 according to an embodiment of the present invention.

As illustrated in FIG. 1, a plasma capacitance diagnosing device 100 according to an embodiment of the present embodiment includes a power supply unit 110, a signal generating unit 120, a protective circuit 130, a capacitance measuring unit 140, and a noise canceller 150.

The power supply unit 110 includes a power source 112, a constant voltage output circuit 114, a parallel terminal block 116. The power supply unit 110 removes a noise by filtering an AC voltage using the AC voltage supplied from a plasma external power source to output the AC voltage, outputs a constant voltage using the AC voltage from which the noise is removed, and divides the output constant voltage in parallel, and the divided constant voltage is used to drive individual circuits. The power source 112 removes a noise by filtering an AC voltage using the AC voltage supplied from an external power source to output the AC voltage. The constant voltage output circuit 114 outputs a constant voltage using the AC voltage from which the noise is removed. The parallel terminal block 116 divides the output constant voltage in parallel and the divided constant voltage is used to drive individual circuits.

The signal generating unit 120 generates a signal having a frequency in a range which does not at least partially overlap a discharging frequency of plasma generated in a plasma generating device to be diagnosed. The plasma generating device is a device to be diagnosed and corresponds to an external component of the plasma diagnosing system of the present invention. Here, when the range does not at least partially overlap the discharging frequency of the plasma, it means that a center frequency is different or a frequency band is different. A discharging frequency of the plasma generating device may be 5 to 20 MHz. A frequency of an electric signal generated in the signal generating unit 120 may be used in a range of 1 kHz to 1 MHz so as not to overlap the plasma discharging frequency. The signal generated in the signal generating unit 120 becomes a reference for measuring a capacitance and desirably has a reference waveform substantially having a sine wave component.

The capacitance measuring unit 140 includes an electrode to which at least a part of plasma generated in the plasma generating device is deposited and the generated signal is applied and measures an electric signal in the electrode. The capacitance measuring unit 140 includes a first electrode pair 144, a second electrode pair 146, and a third electrode pair 142. In this case, when a part of plasma is deposited, it means that the plasma generated from the plasma generating device is deposited on the first electrode pair 144.

At least a part of the plasma generated from the plasma generating device is deposited on the first electrode pair 144 and the first electrode pair has a first capacitance. The plasma generated from the plasma generating device is not deposited on the second electrode pair 146 and the second electrode pair has a first capacitance. The third electrode pair 142 is selectively and electrically connected to the first electrode pair 144 and the second electrode pair 146 and has a second capacitance.

The first electrode pair 144 according to an embodiment forms a capacitance through a reference waveform using an electrode and senses a voltage which varies, by a capacitance formed when the plasma is discharged. The second electrode pair 146 shorts the reference waveform from the first electrode pair 144 and changes a voltage value measured by connecting the reference waveform thereto into a capacitance value to measure the capacitance. For example, the second electrode pair 146 may identify whether the capacitance value can be measured and whether the measured capacitance matches an actual value to measure the change in capacitance. Further, the third electrode pair 142 may provide a reference capacitance value used to measure a variable capacitance value from the first electrode pair 144.

As the plasma generated from the plasma generating device is discharged, the capacitance formed in the electrode is changed and the change in capacitance is represented as a change in voltage. The changed voltage signal is input to the protective circuit 130. A first capacitance of the first electrode pair 144 may be known by the following Equation 1. The first capacitance of the first electrode pair 144 may be calculated by multiplying a value obtained by dividing a second capacitance of the third electrode pair 142 and a voltage of the third electrode pair 142 which varies in accordance with the change in first capacitance of the second electrode pair 146 and a value obtained by subtracting a voltage of the third electrode pair 142 which varies in accordance with the change in first capacitance of the second electrode pair 146 from a voltage which is applied to the entire circuit.

Referring to FIG. 10, a voltage of the third electrode pair 142 which varies in accordance with the change in first capacitance of the second electrode pair 146 may be identified. The entire quantity of electric charge may be known through a correlation between a capacitance of the electrode and a voltage of the electrode using the following Equation 4. The entire quantity of electric charge is equal to a value obtained by multiplying the first capacitance of the first electrode pair 144 and a voltage applied to the first electrode pair 144, a value obtained by multiplying a second capacitance of the third electrode pair 142 and a voltage applied to the third electrode pair 142, and a voltage obtained by dividing a capacitance obtained by adding the first capacitance of the first electrode pair 144 and the second capacitance of the third electrode pair 142 and a voltage applied to the entire circuit. A density of the plasma may be diagnosed using the following Equations 2 and 5. The density of the plasma is a value obtained by multiplying the quantity of electric charge of the plasma and a quantity of electric charge of the electron.

When a magnitude of the electric signal measured by the capacitance measuring unit 140 is greater than a predetermined reference, the protective circuit 130 may limit the magnitude of the electric signal or constantly maintain the limited magnitude of the signal. The user may arbitrarily set the predetermined reference. The protective circuit 130 includes a high voltage limiting circuit and a constant voltage holding circuit. The high voltage limiting circuit limits the magnitude of the electric signal. The constant voltage holding circuit constantly maintains a magnitude of the limited signal. For example, the protective circuit 130 may use a diode, a Zener diode, and a ground to limit the magnitude of the electric signal. The protective circuit 130 serves to protect circuits in the plasma diagnosing system by preventing a high power electric energy from the plasma generating device which is available when the plasma is discharged, from flowing into the circuits in the plasma diagnosing system.

The noise canceller 150 includes a preamplifier 152, a band pass filter 154, a phase detector 156, and a low pass filter 158. The noise canceller 150 filters the electric signal transmitted from the protective circuit 130.

The preamplifier 152 amplifies the electric signal transmitted from the protective circuit 130 to constantly maintain the electric signal and installs a filter circuit at an input terminal which receives a signal from the protective circuit 130 to prevent the damage of the preamplifier 152 due to the electric signal. The filter circuit may include a low pass filter, a high pass filter, a band pass filter, and a band stop filter. The band pass filter 154 sets a frequency of the amplified electric signal in a range which at least partially overlaps the frequency of the plasma to pass a frequency to be passed in the overlapping range of the electric signal in which a plurality of frequencies is mixed. The phase detector 156 may remove the noise using a phase difference between the electric signal which passes the band pass filter 154 and the reference waveform. The low pass filter 158 may pass a low frequency component of the electric signal which passes the phase detector 156.

An observing unit 200 is a device which displays the filtered electric signal on a screen and corresponds to an external component of the plasma capacitance diagnosing device 100 of the present invention. The voltage and the capacitance of the plasma may be observed in real time using the observing unit 200.

FIG. 2 is a diagram of a plasma impedance diagnosing device 300 according to an embodiment of the present invention.

As illustrated in FIG. 2, a plasma impedance diagnosing device 300 according to an embodiment of the present embodiment includes a power supply unit 310, a signal generating unit 320, a protective circuit 330, an impedance measuring unit 340, a first noise canceller, and a second noise canceller 360.

The power supply unit 310 includes a power source 312, a constant voltage output circuit 314, a parallel terminal block 316. The power supply unit 310 removes a noise by filtering an AC voltage using the AC voltage supplied from a plasma external power source to output the AC voltage, outputs a constant voltage using the AC voltage from which the noise is removed, and divides the output constant voltage in parallel, and the divided constant voltage is used to drive individual circuits. The power source 312 removes noise by filtering an AC voltage using the AC voltage supplied from an external power source to output the AC voltage. The constant voltage output circuit 314 outputs a constant voltage using the AC voltage from which the noise is removed. The parallel terminal block 316 divides the output constant voltage in parallel and the divided constant voltage is used to drive individual circuits. The power supply unit 310 may overlap the power supply unit 110.

The signal generating unit 320 generates a signal having a frequency in a range which does not at least partially overlap a discharging frequency of plasma generated in a plasma generating device to be diagnosed. The plasma generating device is a device to be diagnosed and corresponds to an external component of the plasma diagnosing system of the present invention. Here, when the range does not at least partially overlap the discharging frequency of the plasma, it means that a center frequency is different or a frequency band is different. A discharging frequency of the plasma generating device may be 5 to 20 MHz. A frequency of an electric signal generated in the signal generating unit 320 may be used in a range of 1 kHz to 1 MHz so as not to overlap the plasma discharging frequency. The signal generated in the signal generating unit 320 becomes a reference for measuring a capacitance and desirably has a reference waveform substantially having a sine wave component. The signal generating unit 320 may overlap the signal generating unit 120.

The impedance measuring unit 340 includes an electrode to which at least a part of plasma generated in the plasma generating device is deposited and the generated signal is applied and measures an electric signal in the electrode. The electrode includes a first electrode pair 344, a second electrode pair 346, and a third electrode pair 342. At least a part of the plasma generated from the plasma generating device is deposited on the first electrode pair 344 and the first electrode pair has a first impedance. The plasma generated from the plasma generating device is not deposited on the second electrode pair 346 and the second electrode pair has the first impedance. The third electrode pair 342 is selectively and electrically connected to the first electrode pair and the second electrode pair and has a second impedance.

As the plasma is discharged, the impedance formed in the electrode changes and the change in impedance results in the change in voltage. The changed voltage signal is input to the protective circuit 330. The impedance measuring unit 340 may overlap the capacitance measuring unit 140.

When a magnitude of the electric signal measured by the impedance measuring unit 340 is greater than a predetermined reference, the protective circuit 330 may limit the magnitude of the electric signal or constantly maintain the limited magnitude of the signal. The user may arbitrarily set the predetermined reference. The protective circuit 330 includes a high voltage limiting circuit and a constant voltage holding circuit. The high voltage limiting circuit limits the magnitude of the electric signal. The constant voltage holding circuit constantly maintains a magnitude of the limited signal.

For example, the protective circuit 330 may use a diode, a Zener diode, and a ground to limit the magnitude of the electric signal. The protective circuit 330 serves to protect circuits in the plasma diagnosing system by preventing a high power electric energy from the plasma generating device which is available when the plasma is discharged, from flowing into the circuits in the plasma diagnosing system.

The first canceller 350 includes a first preamplifier 352, a first band pass filter 354, a first phase detector 356, and a first low pass filter 358. The first noise canceller 350 filters the electric signal transmitted from the protective circuit 330.

The first preamplifier 352 amplifies the electric signal transmitted from the protective circuit 330 to constantly maintain the electric signal and installs a filter circuit at an input terminal which receives a signal from the protective circuit 330 to prevent the damage of the first preamplifier 352 due to the electric signal. The filter circuit may include a low pass filter, a high pass filter, a band pass filter, and a band stop filter. The first band pass filter 354 sets a frequency of the amplified electric signal in a range which at least partially overlaps the frequency of the plasma to pass a frequency to be passed in the overlapping range of the electric signal in which a plurality of frequencies is mixed.

The first phase detector 356 may remove the noise using a phase difference between the electric signal which passes the first band pass filter 354 and the reference waveform. The first low pass filter 358 may pass a low frequency component of the electric signal which passes the first phase detector 356. The first noise canceller 350 may overlap the noise canceller 150.

The second canceller 360 includes a phase changer 361, a second preamplifier 363, a second band pass filter 365, a second phase detector 367, and a second low pass filter 359. The second noise canceller 360 filters the electric signal transmitted from the protective circuit 330.

The phase changer 361 changes a phase of the electric signal transmitted from the protective circuit 330. The second preamplifier 363 amplifies the electric signal transmitted from the phase changer 361 to constantly maintain the electric signal and installs a filter circuit at an input terminal which receives a signal from the phase changer 361 to prevent the damage of the first preamplifier 363 due to the electric signal. The filter circuit may include a low pass filter, a high pass filter, a band pass filter, and a band stop filter. The second band pass filter 365 sets a frequency of the amplified electric signal in a range which at least partially overlaps the frequency of the plasma to pass a frequency to be passed in the overlapping range of the electric signal in which a plurality of frequencies is mixed.

The second phase detector 367 may remove the noise using a phase difference between the electric signal which passes the second band pass filter 365 and the reference waveform. The second low pass filter 369 may pass a low frequency component of the electric signal which passes the second phase detector 367.

An observing unit 400 is a device which displays the filtered electric signal on a screen and corresponds to an external component of the plasma capacitance diagnosing device 100 of the present invention and includes a first observing unit 402 and a second observing unit 404.

The first observing unit 402 displays an electric signal which passes the first noise canceller 350 on a screen. The second observing unit 404 displays an electric signal which passes the second noise canceller 360 on a screen. The signals displayed on the screens of the first observing unit 402 and the second observing unit 404 have a phase difference. The impedance of the plasma may be measured by measuring an electric signal passing the first noise canceller 350 and an electric signal passing the second noise canceller 360 which have the phase difference. For example, an impedance may be represented by R+jX and R denotes a resistance and X denotes a reactance. When the plasma generated in the plasma generating device is converted into an equivalent circuit, the equivalent circuit may be represented by a serial or a parallel combination of a resistance R, a capacitance C, and an inductance L. The reactance generated due to the capacitance C or the inductance L has a ±90 degrees of phase difference from the resistance. The first observing unit 402 measures a resistance of the electric signal which passes the first noise canceller 350 and the second observing unit 404 sets a phase of an electric signal which passes the second noise canceller 360 to have 90 degree-difference from an electric signal which passes the first noise canceller 350 using the phase changer 361 to measure an impedance of the plasma. The resistance R of the plasma may be represented by a function of a plasma density and an electron temperature. The plasma density may be obtained using a change in capacitance of the plasma generated in the plasma generating device to be diagnosed and the electron temperature may be calculated by measuring the resistance of the plasma. The first observing unit 402 may overlap the observing unit 200.

FIG. 3 is a schematic diagram of a measurement circuit of a plasma capacitance diagnosing device 100 according to an embodiment of the present invention. A first capacitance of the first electrode pair 144 may be known by the following Equation 1. The first capacitance of the first electrode pair 144 may be calculated by multiplying a value obtained by dividing a second capacitance of the third electrode pair 142 and a voltage of the third electrode pair 142 which varies in accordance with the change in second capacitance of the third electrode pair 142 and a value obtained by subtracting a voltage of the third electrode pair 142 which varies in accordance with the change in second capacitance of the third electrode pair 142 from a voltage which is applied to the entire circuit.

The entire quantity of electric charge may be known through a correlation between a capacitance of the electrode and a voltage of the electrode using the following Equation 4. The entire quantity of electric charge is equal to a value obtained by multiplying the first capacitance of the first electrode pair 144 and a voltage applied to the first electrode pair 144, a value obtained by multiplying a second capacitance of the third electrode pair 142 and a voltage applied to the third electrode pair 142, and a voltage obtained by multiplying a capacitance obtained by adding the first capacitance of the first electrode pair 144 and the second capacitance of the third electrode pair 142 and a voltage applied to the entire circuit. A density of the plasma may be diagnosed using the following Equations 2 and 5. The density of the plasma is a value obtained by dividing the quantity of electric charge of the plasma and a quantity of electric charge of the electron.

FIG. 4 is a schematic view illustrating that a plasma capacitance diagnosing device 100 according to an embodiment of the present invention diagnoses plasma using a change in first capacitance of a first electrode pair. FIG. 4 is a schematic view illustrating that the plasma is generated from the plasma generating device, the first electrode pair is located in a vacuum chamber where the plasma is generated, and the plasma is diagnosed using the change in first capacitance of the first electrode pair.

In order to measure the density of the plasma after discharging the plasma, a sensor part of the first electrode pair for measurement which measures a changed value of the capacitance may be configured by an area formed of a dielectric material and an area formed of a conductive material.

The area formed of a dielectric material is generally formed of a material having a high permittivity and the conductive material may be formed of a material having a high conductivity but has a high resistance to the oxidation. The measurement sensor which is a first electrode pair may include an electrode a which forms capacitance, a dielectric layer b formed of a dielectric material, and a dielectric adhesive unit c formed to couple the electrode and the dielectric layer and may be implemented in the form of a coplanar electrode and a double sided electrode.

FIGS. 5 and 6 are views illustrating a first electrode pair formed in the form of a coplanar electrode according to an embodiment of the present invention.

As illustrated in FIG. 5, the first electrode pair formed in the form of a coplanar electrode may be implemented by providing two conductive electrodes a on one dielectric layer b.

The electrode a according to the embodiment may be formed such that a width W of the electrode is larger than a length L of the electrode in consideration of an end effect in the electrode or the electrode may be provided as a circular shaped electrode as illustrated in FIG. 5A to remove the end effect. Further, desirably, the thickness d of the electrode may be 20 to 40 μm.

A forming range of the capacitance (penetration depth: T) varies by a width w of the electrode and a distance D between electrodes in accordance with the formation condition of the electrode and the dielectric plate implemented as described above.

The dielectric layer b prevents the electrode a and the plasma from being in direct contact with each other using the dielectric material and as charges are accumulated on a surface of the dielectric material by the plasma, the capacitance value formed from the electrode a may be changed.

For example, the dielectric layer b may be configured by a lower surface b-2 on which a coplanar electrode is formed and an upper surface b-1 which prevents the electrode from being exposed. Here, a thickness of the lower surface b-2 with which the plasma is in direct contact may be desirably larger than that of the upper surface b-1.

The dielectric material used for the dielectric layer b may be a material having a high permittivity in the case of an atmosphere plasma and more specifically, may use various dielectric materials, such as SiN thin film, a SiN2 thin film, silicon, or polymer, including ceramic based materials.

Further, as illustrated in FIG. 5, the dielectric adhesive unit c formed between the dielectric layers b may be provided to adhere the upper surface b-1 and the lower surface b-2 of the dielectric layer and may be mainly bonded in a liquid state and then baked to be used as an adhesive material.

FIG. 5 illustrates a shape of the electrode a which is implemented in a rectangular shape and FIG. 6 illustrates a shape of the electrode a which is implemented in a circular shape. A height and a range of the capacitance area formed by the circular electrode as illustrated in FIG. 6 may be different from those of FIG. 5.

FIG. 7 is a view illustrating that the plasma is measured using a first electrode pair formed in the form of a coplanar electrode according to an embodiment of the present invention.

The plasma is in direct contact with the first electrode pair implemented in the form of a coplanar electrode. When the plasma enters in the capacitance range formed by the first electrode pair, charges generated by the entering plasma are accumulated on a surface of the dielectric layer to show a change in capacitance.

FIG. 8 is a view illustrating a first electrode pair formed in the form of a double-sided electrode according to an embodiment of the present invention. The first electrode pair implemented in the form of a double-sided electrode is formed such that one electrode a is formed in one of the dielectric layers b. In this case, the characteristic of the dielectric material is the same as the dielectric characteristic of the coplanar electrode as described in detail with reference to FIG. 5 so that the description thereof will be omitted.

The difference between the double-sided type electrode pair and the coplanar type electrode is that a distance D of two electrodes a is arbitrarily adjustable and a distance between electrodes is longer than that of the coplanar type electrode so that the width w of the electrode a is larger than that of the coplanar electrode.

FIG. 9 is a view illustrating that the plasma is measured using a first electrode pair formed in the form of a double-sided electrode according to an embodiment of the present invention.

The measurement of the plasma using the electrode pair in the form of a double-sided electrode is different from that of the coplanar electrode in that since the plasma is not in direct contact with the first electrode pair so that when the plasma passes a capacitance range formed by the electrode a, the plasma is measured. Since the capacitance is changed by charges moving in the plasma, the plasma density may be measured using it.

FIG. 10 is a table illustrating a first capacitance measured by an LCR meter according to an embodiment of the present invention and an error of a first capacitance of a first electrode pole 144 with respect to the first capacitance measured by the LCR meter.

There is a process error in the second electrode pair 146 having the first capacitance on which the plasma generated from the plasma generating device is not deposited, like the first electrode pair 144 having the first capacitance on which at least a part of the plasma generated from the plasma generating device is deposited. Therefore, in order to know an accurate first capacitance, an LCR meter is used. The LCR meter is a device which measures a characteristic value of individual elements in industries which develop or produce electric and electronic parts. The characteristic value may refer to a resistance, an inductance, a capacitance, an impedance, a reactance, a conductance, or a susceptance.

FIG. 11 is a view illustrating a first capacitance of a second electrode pair according to an embodiment of the present invention and a voltage of a third electrode pair. When a voltage of the second electrode pair in accordance with the time is measured after measuring the first capacitance of the second electrode pair using the LCR meter, as illustrated in FIG. 12, a voltage in the third electrode pair in accordance with the first capacitance of the second electrode pair may be identified.

Referring to FIG. 11, the lower the first capacitance of the second electrode pair, the higher the voltage in the third electrode pair. The higher the capacitance of the second electrode pair, the lower the voltage of the third electrode pair. That is, the first capacitance of the second electrode pair is inversely proportional to the voltage of the third electrode pair. The first capacitance of the first electrode pair may be calculated using the changed amount of the voltage of the third electrode pair and the following Equation 1.

FIG. 12 is a view illustrating a result of comparing a first capacitance of a first electrode pair 144 according to an embodiment of the present invention and a first capacitance of a second electrode pair 146. When the first capacitance values of the first electrode pair 144 and the second electrode pair 146 are compared, as the first capacitance value of the first electrode pair 144 is increased, the first capacitance value of the second electrode pair is linearly increased.

After removing the parasitic capacitance of the first electrode 144, the first capacitance of the first electrode pair 144 and the first capacitance of the second electrode pair 146 may be compared. The parasitic capacitance may be calculated using a voltage measured at the third electrode pair 142 when the plasma generating device discharges the plasma and the third electrode pair 142 and the first electrode pair 144 are connected. Referring to FIG. 10, a value corresponding to 0. Pf in the graph is a voltage value when the third electrode pair 142 and the first electrode pair 144 are connected. The parasitic capacitance may be calculated using the voltage value and Equation 1.

The parasitic capacitance refers to a capacitance which exists when a wiring line is proximate to other metal part or a plurality of lines such as coils is provided in parallel.

FIG. 13 is a view illustrating a result of comparing a first capacitance of a first electrode pair 144 obtained by removing a parasitic capacitance of the first electrode pair 144 according to an embodiment of the present invention and a first capacitance of a second electrode pair 146. When a gradient of a straight line of FIG. 13 is equal to a gradient of a straight line of FIG. 4, it means that a predetermined parasitic capacitance exists in the first electrode pair 144.

Based on the tendency of the capacitance which decreases as the plasma discharge starts, it is assumed that charged particles in the plasma are the main cause of the change in capacitance. Therefore, the plasma density may be diagnosed by the change in the first capacitance pair during the plasma process in accordance with the principle.

FIG. 14 is a view illustrating a result of measuring a voltage change in accordance with plasma discharging according to an embodiment of the present invention. When the plasma generating device to be diagnosed generates plasma, the voltage of the plasma is rapidly decreased and when the plasma generating device to be diagnosed discharges the plasma, the voltage of the plasma is rapidly increased.

FIG. 15 is a view illustrating a result of diagnosing a density of plasma using a change in capacitance in accordance with plasma discharging according to an embodiment of the present invention. The plasma capacitance diagnosing device measures a change between a capacitance of the plasma before being discharged and a capacitance of the plasma after being discharged. When the plasma generating device to be diagnosed generates plasma, the capacitance of the plasma is rapidly increased and when the plasma generating device to be diagnosed discharges the plasma, the capacitance of the plasma is rapidly decreased.

Based on the tendency of the capacitance of the plasma which decreases as the plasma generating device starts discharging the plasma, it is considered that charged particles in the plasma are the main cause of the change in capacitance. Therefore, the density of the plasma may be diagnosed by the changing of the capacitance of the plasma during the plasma process. The charged particles are ion particles which have electrically positive or negative charges. For example, the charged particles are particles having positive or negative charges, such as ions, protons, or electrons.

FIG. 16 is a view illustrating a result of comparing a plasma density measured using a double Langmuir probe (DLP) according to an embodiment of the present invention and a plasma density in every position in a space where a plasma diagnosing device is provided. When the plasma density measured using the double Langmuir probe (DLP) and the plasma density in every position in a space where the plasma diagnosing device is provided are compared, it is confirmed that the same tendency may be seen. The double Langmuir probe (DLP) includes two probes and measures a plasma density using two probes.

FIG. 17 is a graph of comparing a plasma density depending on a gas flow rate according to an embodiment of the present invention. Referring to FIG. 17, several conditions such as an input power and a distance between plasma sources of the first electrode pair are maintained to be the same and only a gas flow rate is changed to measure the plasma density. A graph a is a density graph of plasma which discharges a mixture gas having a ratio of Ar of 8 LPM and $O_2$ of 10 LPM and an average value is $1.9 \times 10^{10}$ $cm^{-3}$. In contrast, a graph b is a density graph of plasma which discharges a mixture gas having a ratio of Ar of 8 LPM and $O_2$ of 20 LPM and an average value is $6.0 \times 10^9$ $cm^3$.

FIG. 18 is a flowchart illustrating a plasma capacitance diagnosing method according to an embodiment of the present invention.

A capacitance diagnosing method according to the present embodiment is configured by the following steps which are processed in a time series manner in the plasma capacitance diagnosing device 100.

In step S110, the signal generating unit 120 generates a signal having a frequency in a range which does not at least partially overlap a frequency of plasma generated in a plasma generating device to be diagnosed.

In step S120, the plasma generating device to be diagnosed discharges or does not discharge the plasma.

In step S130, the capacitance measuring unit 140 determines whether a first capacitance of the first electrode pair 144 on which at least a part of the plasma generated from the plasma generating device is deposited is equal to a first capacitance of the second electrode pair 146 on which the plasma generated from the plasma generating device is not deposited. If the first capacitance of the first electrode pair 144 is not equal to the first capacitance of the second electrode pair as the result of the determination in step S130, steps S130 to S140 are repeated until the first capacitance of the first electrode pair 144 is equal to the first capacitance of the second electrode pair 146.

In step S140, the capacitance measuring unit 140 compensates the first capacitance of the first electrode pair 144 by the first capacitance of the second electrode pair 146.

In step S150, when the magnitude of the electric signal measured by the capacitance measuring unit 140 is larger than a predetermined reference, the protective circuit 130 limits the magnitude of the electric signal.

In step S160, the noise canceller 150 filters the electric signal transmitted from the protective circuit 130.

FIG. 19 is a flowchart illustrating a plasma impedance diagnosing method according to an embodiment of the present invention.

An impedance diagnosing method according to the present embodiment is configured by the following steps which are processed in a time series manner in the plasma impedance diagnosing device 300.

In step S210, the signal generating unit 320 generates a signal having a frequency in a range which does not at least partially overlap a frequency of plasma generated in a plasma generating device to be diagnosed.

In step S220, the plasma generating device to be diagnosed discharges or does not discharge the plasma.

In step S230, the impedance measuring unit 340 determines whether a first impedance of the first electrode pair 344 on which at least a part of the plasma generated from the plasma generating device is deposited is equal to a first impedance of the second electrode pair 346 on which the plasma generated from the plasma generating device is not deposited. If the first impedance of the first electrode pair 344 is not equal to the first impedance of the second electrode pair as the result of the determination in step S230, steps S230 to S240 are repeated until the first impedance of the first electrode pair 344 is equal to the first impedance of the second electrode pair 346.

In step S240, the impedance measuring unit 340 compensates the first impedance of the first electrode pair 344 by the first impedance of the second electrode pair 346.

In step S250, when the magnitude of the electric signal measured by the impedance measuring unit 340 is larger than a predetermined reference, the protective circuit 330 limits the magnitude of the electric signal.

In step S260, the second noise canceller 360 changes a phase of the electric signal with a limited magnitude.

In step S270, the first noise canceller 350 and the second noise canceller 360 filter the electric signal with a limited magnitude.

FIG. 20 is a flowchart illustrating step S160 of FIG. 18 in detail.

In step S162, the preamplifier 152 amplifies the electric signal transmitted from the protective circuit 130 to be constantly maintained.

In step S164, the band pass filter 154 filters the amplified electric signal.

In step S166, the phase detector 156 detects a difference between a phase of the filtered electric signal and a phase of a signal having a reference waveform to remove the noise.

In step S168, the low pass filter 158 filters the signal from which the noise is removed.

$$C_X = \frac{C_r V'_r}{V_I - V'_r} \quad \text{[Equation 1]}$$

Here, $C_x$ is a first capacitance of the first electrode pair, $C_r$ is a second capacitance of the third electrode pair, $V_I$ is a voltage which is applied to the entire circuit, and $V'_r$ is a voltage of the third electrode pair which changes in accordance with the change in the first capacitance of the second electrode pair.

The capacitance diagnosing unit 140 includes a first electrode pair 144, a second electrode pair 146, and a third electrode pair 142. At least a part of the plasma generated from the plasma generating device is deposited on the first electrode pair 144 and the first electrode pair has a first capacitance. The plasma generated from the plasma generating device is not deposited on the second electrode pair 146 and the second electrode pair has the first capacitance. The third electrode pair 142 is selectively and electrically connected to the first electrode pair 144 and the second electrode pair 146 and has a second capacitance. The first capacitance of the first electrode pair 144 may be calculated by multiplying a value obtained by multiplying a second capacitance of the third electrode pair 142 and a voltage of the third electrode pair which varies in accordance with the change in first capacitance of the second electrode pair and a value obtained by subtracting a voltage of the third electrode pair which varies in accordance with the change in first capacitance of the second electrode pair from a voltage which is applied to the entire circuit. An accurate first capacitance may be found using the Equation 1.

$$Q_0 = (q_p + Q_i) \quad \text{[Equation 2]}$$

Here, $Q_0$ is an entire quantity of electric charge, $q_p$ is a quantity of electric charge, and $Q_i$ is an initial quantity of electric charge.

The entire quantity of electric charge is a sum of a quantity of electric charge of the plasma and an initial quantity of electric charge.

$$Q = CV \quad \text{[Equation 3]}$$

Here, Q is a quantity of electric charge, C is a capacitance, and V is a voltage.

The quantity of electric charge is a value obtained by multiplying the capacitance and the voltage.

$$Q = Q_0 = (q_p + Q_i) = C_x V_x = C_r V_r = C_T V_I \quad \text{[Equation 4]}$$

Here, $C_x$ is a first capacitance of the first electrode pair, $V_x$ is a voltage applied to the first electrode pair, $C_r$ is a second capacitance of the third electrode pair, $V_r$ is a voltage applied to the third electrode pair, $V_I$ is a voltage applied to the entire circuit, and $C_T$ is a capacitance obtained by adding a first capacitance of the first electrode pair and a second capacitance of the third electrode pair.

The entire quantity of electric charge is equal to a value obtained by multiplying the first capacitance of the first electrode pair 144 and a voltage applied to the first electrode pair 144, a value obtained by multiplying a second capacitance of the third electrode pair 142 and a voltage applied to the third electrode pair 142, and a voltage obtained by multiplying a capacitance obtained by adding the first capacitance of the first electrode pair 144 and the second capacitance of the third electrode pair 142 and a voltage applied to the entire circuit. The quantity of electric charge may be calculated by the correlation between the capacitance and the voltage using Equation 4.

$$n_e = \frac{q_p}{e} \quad \text{[Equation 5]}$$

Here, $n_e$ is a density of plasma and e is a quantity of electric charge.

The density of the plasma is a value obtained by dividing the quantity of electric charge of plasma and a quantity of electric charge and the plasma density is diagnosed using Equation 5.

The above description illustrates a technical spirit of the present invention as an example and various changes, modifications, and substitutions may be made by those skilled in the art within a scope of an essential characteristic of the present invention. Therefore, as is evident from the foregoing description, the exemplary embodiments and accompanying drawings disclosed in the present invention do not limit the technical spirit of the present invention and the scope of the technical spirit is not limited by the exemplary embodiments and accompanying drawings. The protective scope of the present invention should be construed based on the following claims, and all the technical concepts in the equivalent scope thereof should be construed as falling within the scope of the present invention.

The invention claimed is:

1. A plasma diagnosing system, comprising:
a signal generating unit which generates a signal having a frequency in a range which does not at least partially overlap a frequency of plasma generated from a plasma generating device to be diagnosed;
a capacitance measuring unit which includes an electrode to which at least a part of plasma generated in the plasma generating device is deposited and the generated signal is applied and measures an electric signal in the electrode;
a protective circuit which limits a magnitude of an electric signal when the magnitude of the electric signal measured in the capacitance measuring unit is larger than a predetermined reference; and
a noise canceller which filters the electric signal transmitted from the protective circuit.

2. The plasma diagnosing system of claim 1, wherein a signal generated from the signal generating unit includes a signal which is a reference for measuring a capacitance and has a reference waveform substantially having a sine wave component.

3. The plasma diagnosing system of claim 2, wherein the noise canceller includes:
a preamplifier which amplifies an electric signal transmitted from the protective circuit to be constantly maintained;
a band pass filter which filters the amplified electric signal;
a phase detector which detects a difference between a phase of the filtered electric signal and a phase of a signal having the reference waveform to remove the noise; and
a low pass filter which filters a signal from which the noise is removed.

4. The plasma diagnosing system of claim 1, wherein the capacitance measuring unit includes:
a first electrode pair having a first capacitance on which at least a part of the plasma generated from the plasma generating device is deposited; and
a second electrode pair having the first capacitance on which the plasma generated from the plasma generating device is not deposited.

5. The plasma diagnosing system of claim 4, wherein the first electrode pair includes:
an electrode which forms a first capacitance; and
a dielectric layer which is formed of a dielectric material to cover both surfaces of the electrode to prevent the plasma generated from the plasma generating device from being in contact with the electrode.

6. The plasma diagnosing system of claim 4, wherein the capacitance measuring unit further includes:
a third electrode pair which is selectively and electrically connected to the first electrode pair and the second electrode pair and has a second capacitance.

7. The plasma diagnosing system of claim 4, wherein the first capacitance of the first electrode pair is decreased as at least a part of the plasma generated from the plasma generating device is deposited.

8. The plasma diagnosing system of claim 1, wherein the protective circuit limits a magnitude of the electric signal or maintains the limited magnitude of the signal to be constant.

9. A plasma diagnosing system, comprising:
a signal generating unit which generates a signal having a frequency in a range which does not at least partially overlap a frequency of plasma generated from a plasma generating device to be diagnosed;
an impedance measuring unit which includes an electrode to which at least a part of plasma generated in the plasma generating device is deposited and the generated signal is applied and measures an electric signal in the electrode;
a protective circuit which limits a magnitude of the electric signal when a magnitude of an electric signal measured in the impedance measuring unit is larger than a predetermined reference; and
a first filtering unit and a second filtering unit which filter an electric signal transmitted from the protective circuit.

10. The plasma diagnosing system of claim 9, wherein a signal generated from the signal generating unit includes a signal which is a reference for measuring an impedance and has a reference waveform substantially having a sine wave component.

11. The plasma diagnosing system of claim 10, wherein the first noise canceller includes:
a first preamplifier which amplifies an electric signal transmitted from the protective circuit to be constantly maintained;
a first band pass filter which filters the amplified electric signal;
a first phase detector which detects a difference between a phase of the filtered electric signal and a phase of a signal having the reference waveform to remove the noise; and
a first low pass filter which filters a signal from which the noise is removed.

12. The plasma diagnosing system of claim 10, wherein the second noise canceller includes:
a phase changer which changes a phase of an electric signal transmitted from the protective circuit;
a second preamplifier which amplifies an electric signal with a changed phase to be constantly maintained;
a second band pass filter which filters the amplified electric signal;
a second phase detector which detects a difference between a phase of the filtered electric signal and a phase of a signal having the reference waveform to remove the noise; and
a second low pass filter which filters a signal from which the noise is removed.

13. The plasma diagnosing system of claim 9, wherein the impedance measuring unit includes:
a first electrode pair having a first impedance on which at least a part of the plasma generated from the plasma generating device is deposited; and
a second electrode pair having the first impedance on which the plasma generated from the plasma generating device is not deposited.

14. The plasma diagnosing system of claim 13, wherein the first electrode pair includes:
an electrode which forms a first capacitance; and
a dielectric layer which is formed of a dielectric material to cover both surfaces of the electrode to prevent the plasma generated from the plasma generating device from being in contact with the electrode.

15. The plasma diagnosing system of claim 13, wherein the impedance measuring unit further includes:

a third electrode pair which is selectively and electrically connected to the first electrode pair and the second electrode pair and has a second impedance.

16. The plasma diagnosing system of claim 13, wherein the first impedance of the first electrode pair is decreased as at least a part of the plasma generated from the plasma generating device is deposited.

17. The plasma diagnosing system of claim 9, wherein the protective circuit limits a magnitude of the electric signal or maintains the limited magnitude of the signal to be constant.

18. A plasma diagnosing method, comprising:
generating a signal having a frequency in a range which does not at least partially overlap a frequency of plasma generated from a plasma generating device to be diagnosed;
measuring an electric signal from an electrode on which at least a part of the generated plasma is deposited and the generated signal is applied;
limiting a magnitude of the electric signal when a magnitude of an electric signal measured in the capacitance measuring unit is larger than a predetermined reference; and
filtering an electric signal with the limited magnitude.

19. The plasma diagnosing method of claim 18, wherein the measuring of an electric signal measures the electric signal using a first electrode pair having a first capacitance on which at least a part of the generated plasma is deposited; and a second electrode pair having the first capacitance on which the generated plasma is not deposited.

20. The plasma diagnosing method of claim 18, wherein the measuring of an electric signal measures the electric signal further using a third electrode pair which is selectively and electrically connected to the first electrode pair and the second electrode pair and has a second capacitance.

* * * * *